United States Patent
Moses et al.

(10) Patent No.: US 7,304,313 B2
(45) Date of Patent: Dec. 4, 2007

(54) LOW-PRESSURE CHAMBER FOR SCANNING ELECTRON MICROSCOPY IN A WET ENVIRONMENT

(75) Inventors: Elisha Moses, Rehovot (IL); Stephan Yves Thiberge, La Celle St. Cloud (FR)

(73) Assignee: Quantomix Ltd., Nes-Ziona (IL)

( * ) Notice: Subject to any disclaimer, the term of this patent is extended or adjusted under 35 U.S.C. 154(b) by 117 days.

(21) Appl. No.: 10/516,407

(22) PCT Filed: Jun. 1, 2003

(86) PCT No.: PCT/IL03/00455

§ 371 (c)(1),
(2), (4) Date: Dec. 2, 2004

(87) PCT Pub. No.: WO03/104847

PCT Pub. Date: Dec. 18, 2003

(65) Prior Publication Data

US 2005/0279938 A1    Dec. 22, 2005

(30) Foreign Application Priority Data

Jun. 5, 2002    (IL) ..................................... 150056

(51) Int. Cl.
*G21K 5/08* (2006.01)
(52) U.S. Cl. ............................................. 250/440.11
(58) Field of Classification Search ............. 250/440.1, 250/440.11, 441.1, 310
See application file for complete search history.

(56) References Cited

U.S. PATENT DOCUMENTS 3,218,459 A    11/1965    Bens
3,378,684 A    4/1968    Mentink et al
3,657,596 A    4/1972    Goetze et al (Continued)

FOREIGN PATENT DOCUMENTS

WO    WO 02/14830    2/2002

(Continued)

OTHER PUBLICATIONS

Angulo P., "Nonalcoholic Fatty Liver Disease", N. Engl J. Med, vol. 346, No. 16, 1221-31, 2002.

(Continued)

*Primary Examiner*—Robert Kim
*Assistant Examiner*—Johnnie L Smith, II
(74) *Attorney, Agent, or Firm*—Pearl Cohen Zedek Latzer LLP

(57) ABSTRACT

A specimen enclosure assembly (100) for use in an electron microscope and including a rigid specimen enclosure dish (102) having an aperture (122) and defining an enclosed specimen placement volume (125), an electron beam permeable, fluid impermeable, cover (114) sealing the specimen placement volume (125) at the aperture (122) from a volume outside the enclosure and a pressure controller communicating with the enclosed specimen placement volume (125) and being operative to maintain the enclosed specimen placement volume (125) at a pressure, which exceeds a vapor pressure of a liquid sample (123) in the specimen placement volume (125) and is greater than a pressure of a volume outside the enclosure, whereby a pressure differential across the cover (114) does not exceed a threshold level at which rupture of the cover (114) would occur.

26 Claims, 8 Drawing Sheets

U.S. PATENT DOCUMENTS

| | | | |
|---|---|---|---|
| 4,037,109 A | | 7/1977 | Hosokawa et al. |
| 4,071,766 A | * | 1/1978 | Kalman et al. .......... 250/443.1 |
| 4,115,689 A | | 9/1978 | Won |
| 4,308,457 A | | 12/1981 | Reimer |
| 4,448,311 A | | 5/1984 | Houser |
| 4,587,666 A | | 5/1986 | Torrisi et al. |
| 4,596,928 A | | 6/1986 | Dantilatos |
| 4,609,809 A | | 9/1986 | Yamaguchi et al. |
| 4,618,938 A | | 10/1986 | Sandland et al. |
| 4,705,949 A | * | 11/1987 | Grimes et al. ......... 250/440.11 |
| 4,720,622 A | | 1/1988 | Iwata et al. |
| 4,720,633 A | | 1/1988 | Nelson |
| 4,880,976 A | | 11/1989 | Mancuso et al. |
| 4,929,041 A | | 5/1990 | Vahala et al. |
| 4,992,662 A | | 2/1991 | Danilatos |
| 5,097,134 A | * | 3/1992 | Kimoto et al. ........... 250/443.1 |
| 5,103,102 A | | 4/1992 | Economou et al. |
| 5,122,663 A | | 6/1992 | Chang et al. |
| 5,250,808 A | | 10/1993 | Danilatos et al. |
| 5,323,441 A | | 6/1994 | Torrisi et al. |
| 5,326,971 A | | 7/1994 | Theodore et al. |
| 5,362,964 A | | 11/1994 | Knowles et al. |
| 5,406,087 A | * | 4/1995 | Fujiyoshi et al. ...... 250/440.11 |
| 5,412,211 A | | 5/1995 | Knowles |
| 5,466,940 A | | 11/1995 | Litman et al. |
| 5,502,306 A | | 3/1996 | Meisburger et al. |
| 5,644,132 A | | 7/1997 | Litman et al. |
| 5,667,791 A | | 9/1997 | Hersh et al. |
| 5,789,748 A | | 8/1998 | Liu et al. |
| 5,811,803 A | | 9/1998 | Komatsu et al. |
| 5,859,699 A | | 1/1999 | Baer et al. |
| 5,898,261 A | * | 4/1999 | Barker ....................... 313/420 |
| 5,945,672 A | | 8/1999 | Knowles et al. |
| 6,025,592 A | | 2/2000 | Knowles et al. |
| 6,072,178 A | | 6/2000 | Mizuno |
| 6,114,695 A | | 9/2000 | Todokoro et al. |
| 6,130,434 A | | 10/2000 | Mitchell et al. |
| 6,157,446 A | | 12/2000 | Baer et al. |
| 6,365,898 B1 | | 4/2002 | Sudraud et al. |
| 6,452,177 B1 | | 9/2002 | Feldman et al. |
| 6,989,542 B2 | * | 1/2006 | Moses et al. .......... 250/440.11 |
| 6,992,300 B2 | * | 1/2006 | Moses et al. .......... 250/440.11 |
| 2004/0046120 A1 | | 3/2004 | Moses et al. |
| 2004/0217297 A1 | | 11/2004 | Moses et al. |
| 2005/0173632 A1 | * | 8/2005 | Behar et al. ................. 250/311 |

FOREIGN PATENT DOCUMENTS

| | | |
|---|---|---|
| WO | WO 02/45125 | 6/2002 |
| WO | WO 03/104848 | 1/2003 |
| WO | WO/2004/075209 | 2/2004 |

OTHER PUBLICATIONS

Ault K.A, et al. "In-Vivo Biotinylation Demonstrates that Reticulated Platelets are the Youngest Platelets in Circulation", Exp Hematology, 23, 996-1001, 1995.

Becker, R.P. and Sogard, M., "Visualization of Subsurface Structures in Cells and Tissues by Backscattered Electron Imaging", Scanning Electron Microscopy (II), 835-870, 1979.

Birks J. B., "The Theory and Practice of Scintillation Counting", Pergamon Press, 1964.

Bozza P.T. et al., "Pathways for Eosinophil Lipid Body Induction: Differing Signal Transduction in Cells from Normal and Hypereosinophilic Subjects", Journal of Leukocyte Biology, vol. 64, 563-569, 1998.

Brocker W. and Pfefferkorn G., "Applications of the Cathodoluminescence Method in Biology and Medicine", Scanning Electron Microscopy vol. II, 125-132, 1979.

Burns W. A. et al., "The Clinician's View of Diagnostic Electron Microscopy", Human Pathology, 6, 467-78, 1975.

Carlen, B. and Englund, E., "Diagnostic Value of Electron Microscopy in a Case of Juvenile Neuronal Ceroid Lipofuscinosis", Ultrastructural Pathology 25, 285-288, 2001.

Davison E. & Colquhoun W., "Ultrathin Formvar Support Films for Transmission Electron Microscopy". J. Elec. Microsc. Tech. vol. 2, 35-43, 1985.

Cook G.S. & Costreton J.W., "Foley Catheter Biofilm Formation Comparison Study in an InVitro Assay", unknown publication date, http://www.bacterin.com/pdf/whitepaper.pdf de Assis E. F. et al, "Synergism Between Platelet-Activating Factor-Like Phospholipids and Perxisome Proliferator-Activated Receptor Gamma Agonists Generated During Low Density Lipoprotein Oxidation the Induces Lipid Body Formation in Leukocytes", The Journal of Immunology, 171, 2090-2098, 2003.

De Mets M. and Lagasse A., "An Investigation of Some Organic Chemicals as Cathodoluminescent Dyes using the Scanning Electron Microscope" Journal of Microscopy vol. 94, 151-156, 1971.

De Rijk Eveline P.C.T. et al, "A Fast Histochemical Staining Method to Identify Hyaline Droplets in the Rat Kidney", Toxicologic Pathology, vol. XXXI, 462-464, 2003.

Dykstra M.J. et al, "Suggested Standard Operating Procedures (SOPs) for the Preparation of Electron Microscopy Samples for Toxicology/Pathology Studies in a GLP Environment", Toxicologic Pathology, vol. XXX, 735-743, 2002.

Feinerman & Crewe, "Miniature Electron Optics", Advances in Imaging and Electron Physics, vol. 102, 187, 1998.

Fisher C. et al., "An Assessment of the Value of Electron Microscopy in Tumor Diagnosis", Journal Clinical Pathology 38, 403-408, 1985.

Garman R. H. et al., "Method to Identify and Characterize Developmental Neurotoxicity for Human Health Risk Assessment. II: Neuropathology", Environmental Health Perspective, vol. 109, 93-100, 2001.

Gileadi O. et al, "Squid Sperm to Clam Eggs: Imaging Wet Samples in a Scanning Electron Microscope", Biol. Bull., 205, 177-179, 2003.

Goldstein et al., Scanning Electron Microscopy and X-ray Microanalysis, Pleneum Press, New York, London, 1992.

Goodpaster B. H. et al., "Skeletal Muscle Lipid Content and Insulin Resistance: Evidence for a Paradox in Endurance- Trained Athletes", The Journal of Clinical Endocrinology & Metabolism 86 (12), 5755-5761, 2001.

Grande JP et al., "Renal Biopsy in Lupus Nephritis", Lupus 7, 611-617, 1998.

Green E.D.H "Atmospheric Scanning Electron Microscopy" Ph. D Dissertation, Department of Electronic Engineering, Stanford University, 1992.

Griffiths "Trends in Cell Biology", V. 11 :153-154, 2001.

Gu Xin et al, "The Value of Electron Microscopy in the Diagnosis of IgA Nephropathy", Ultrastructural Pathology 26, 203-210, 2002.

Gyorkey F. et al., "The Usefulness of Electron Microscopy in the Diagnosis of Human Tumors", Human Pathology 6, 421-441, 1975.

Handley & Olsen, "Butvar B-98 As A Thin Support Film", Ultramicroscopy vol. 4, 479-480, 1979.

Hard G. C. et al., "Risk Assessment of d-Limonene: An Example of Male Rat-Specific Renal Tumorigens", Critical Reviews in Toxicology, 24 (3), 231-254, 1994.

Harris L. G. et al., "Contrast Optimisation for Backscattered Electron Imaging of Resin Embedded Cells", Scanning Microscopy, vol. 13, No. 1, 71-81, 1999.

Hayat, M.A., "Principles and Techniques of Electron Microscopy - Biological Applications", Fourth edition, Cambridge University Press, 2000.

Hermann, R., Walther, P. and Müller, M., "Immunogold-labeling in Scanning Electron Microscopy", Histochem, Cell. Biol., 106,31-39, 1996.

Herrera G. A., "The Value of Electron Microscopy in the Diagnosis and Clinical Management of Lupus Nephritis", Ultrastructural Pathology 23, 63-77, 1999.

Hoffman-Fezer et al., "Preclinical Evaluation of Biotin Labeling for Red Cell Survival Testing" Annals of Hematology, vol. 74, 231-238, 1997.

Hollinshead M. et al., "Anti-biotin Antibodies Offer Superior Organelle-specific Labeling of Mitochondria over Avidin or Streptavidin", The Journal of Histochemistry & Cytochemistry, 45 (8), 1053-7, 1997.

Hough P.V.C. et al., "Identification of Biological Molecules in situ at High Resolution via the Fluorescence Excited by a Scanning Electron Beam", Proceedings of the National Academy of Sciences of the United States of America, vol. 73, No. 2, 317-321, 1976.

J.B. Steyn, et al, "An Efficient Spectroscopic Detection System for Cathodoluminescence Mode Scanning Electron Microscopy (SEM)", Journal of Microscopy, vol. 107, Pt 2, Jul. 1976, pp. 107-128.

Kelley D. E. et al, "Dysfunction of Mitochondria in Human Skeletal Muscle in Type 2 Diabetes", Diabetes vol. 51, 2944-2950, 2002.

Kelley D. E. et al, "Muscle Triglyceride and Insulin Resistance", Annu. Rev. Nutr. 22, 325-46, 2002.

Kirkpatrick P., "High-Throughput Screening Birds of a Feather . . . ", Nature Reviews Drug Discovery V. 1, 330, 2002.

Kristiansen, E. and Madsen, C., "Induction of Protein Droplet (alpha-2 microglobulin) Nephropathy in Male Rats After Short-Term Dosage with 1,8-cineole and I-limonene", Toxicology Letters 80, 147-152, 1995.

Lehning E. J. et al, "Gamma-Diketone Peripheral Neuropathy", Toxicology and Applied Pharmacology 165, 127-140, 2000.

Levit-Binnun N. et al, "Quantitative Detection of Protein Arrays", Anal. Chem. 75, 1436-1441, 2003.

LoPachin R. M. et al, "Gamma-Diketone Central Neuropathy: Quantitive Morphometric Analysis of Axons in Rat Spinal Cord White Matter Regions and Nerve Roots", Toxicology and Applied Pharmacology, 193, 29-46, 2003.

Mathews R.G., "Conditions for Imaging Emulsions in the Environment Scanning Electron Microscope", Scanning, V. 24, 75-85, 2002.

McGovern S. L. et al, "A Common Mechanism Underlying Promiscuous Inhibitors from Virtual and High-Throughput Screening", J. Med. Chem, 45, 1712-1722, 2002.

McIntosh R. J., "Electron Microscopy of Cells: A New Beginning for a New Century", The Journal of Cell Biology, vol. 153, No. 6, F25-F32, 2001.

McKinney W. and Hough Paul V.C., "A New Detector System for Cathodoluminescence Microscopy", Scanning Electron Microscopy, vol. I, 251-256, 1977.

Mittler, M.A., Walters, B.C. and Stopa, E.G., "Observer Reliability in Histological Grading of Astrocytoma Sterotactic Biopsies", J. Neurosurg 85, 1091-1094, 1996.

Moriki T. et al., "Activation of Preformed EGF Receptor Dimers by Ligand-induced Rotation of the Transmembrane Domain", J. Mol. Biol. 311, 1011-1026, 2001.

Muskhelishvili L. et al, "An Immunohistochemical Label to Facilitate Counting of Ovarian Follicles", Toxicologic Pathlogy, vol. XXX, 400-402, 2002.

Nyska A. et al, "Biocompatibility of the Ex-PRESS Miniature Glaucoma Drainage Implant", Journal of Glaucoma, vol. XII, 275-280, 2003.

Pacheco P. et al, "Lipopolysaccaride-Induced Leukocyte Lipid Body Formation In Vivo: Innate Immunity Elicited Intracellular Loci Involved in Eicosanoid Metabolism", The Journal of Immunology, 169, 6498-6506, 2002.

Petersen K. F. et al, "Mitochondrial Dysfunction in the Elderly: Possible Role in Insulin Resistence", Science, vol. 300, 1140-1142, 2003.

Prescott-Mathews J. S., et al., "Methyl tert-Butyl Ether Causes alpha2u-Globulin Nephropathy and Enhanced Renal Cell Proliferation in Male Fischer-344 Rats", Toxicology and Applied Pharmacology, vol. 143, 301-314, 1997.

Robinson V.N.E., "The Examination of Hydrated Specimens in Electron Microscopes", Analysis of organic and biological surfaces, P. Echlin, 191-207, John Wiley and Sons, New York, 1984.

Sedar, A.W., Silver, M.J. and Ingerman-Wojenski, C.M., "Backscattered Electron Imaging to Visualize Arterial Endothelial Detachment in the Scanning Electron Microscope", Scanning Electron Microscopy, vol. II, 969-74, 1983.

Shulman G. I., "Cellular Mechanisms of Insulin Resistance", the Journal of Clinical Investigation, vol. 106, No. 2, 171-176, 2000.

Singer I. I. et al. "CCR5, CXCR4 and CD4 Are Clustered and Closely Apposed on Microvilli of Human Macrophages and T Cells", Journal of Virology, vol. 75, No. 8, 3779-3790, 2001.

Spargo, B.H., "Practical use of Electron Microscopy for the Diagnosis of Glomerular Disease", Human Pathology vol. 6, 405-420, 1975.

Swift & Brown, J. Phys. E: Sci. Instrum. 3, 924-926, 1970.

Thornley, "New Applications of the Scanning Electron Microscope", Ph. D Dissertation 3886, Corpus Christi College, Cambridge, 1960.

Tucker, J.A., "The Continuing Value of Electron Microscopy in Surgical Pathology", Ultrastructural Pathology, vol. 24, 383-9, 2000.

Weisberg S. P et al, "Obesity is Associated with Macrophage Accumulation in Adipose Tissue", Journal of Clinical Investigation, vol. 112 No. 12, 1796-1808, 2003.

Wellen K. E. et al, "Obesity-Induced Inflammatory Changes Adipose Tissue", The Journal of Clinical Investigation, vol. 112 No. 12, 1785-88, 2003.

Weller P.F. et al., "Cytoplasmic Lipid Bodies of Neutrophils: Formation Induced by cis- Unsaturated Fatty Acids and Mediated by Protein Kinase C", The Journal of Cell Biology, vol. 113, No. 1, 137-146, 1991.

Xu H. et al "Chronic Inflammation in Fat Plays a Crucial Role in the Development of Obesity-Related Insulin Resistance", Journal of Clinical Investigation, vol. 112 No. 12, 1821-30, 2003.

Schlessinger J., "Ligand-Induced, Receptor-Mediated Dimerization and Activation of EGF Receptor", Cell vol. 110, 669-672, 2002.

International Search Report. Application Number PCT/IL0300455 Mailed Mar. 11, 2004.

* cited by examiner

US 7,304,313 B2

LOW-PRESSURE CHAMBER FOR SCANNING ELECTRON MICROSCOPY IN A WET ENVIRONMENT

CROSS-REFERENCE TO RELATED APPLICATIONS

This application is a National Phase Application of PCT International Application No. PCT/IL2003/000455, International Filing Date Jun. 1, 2003, claiming priority of Israel Patent Application Serial No. 150056, filed Jun. 5, 2002, entitled "Low Pressure Chamber for Scanning Electron Microscopy in a Wet Environment".

FIELD OF THE INVENTION

The present invention relates to specimen enclosures for scanning electron microscope (SEM) inspection systems and more particularly to fluid specimen enclosures.

BACKGROUND OF THE INVENTION

The following patent documents are believed to represent the current state of the art:

U.S. Pat. Nos. 4,071,766; 4,720,633; 5,250,808; 5,326,971; 5,362,964; 5,417,211; 4,705,949; 5,945,672; 6,365,898; 6,130,434; 6,025,592; 5,103,102; 4,596,928; 4,880,976; 4,992,662; 4,720,622; 5,406,087; 3,218,459; 3,378,684; 4,037,109; 4,448,311; 4,115,689; 4,587,666; 5,323,441; 5,811,803; 6,452,177; 5,898,261; 4,618,938; 6,072,178; 4,929,041 and 6,114,695.

SUMMARY OF THE INVENTION

The present invention seeks to provide apparatus and systems for enabling scanning electron microscope inspection of fluid containing specimens.

There is thus provided in accordance with a preferred embodiment of the present invention a specimen enclosure assembly for use in an electron microscope and including a rigid specimen enclosure dish having an aperture and defining an enclosed specimen placement volume, an electron beam permeable, fluid impermeable, cover sealing the specimen placement volume at the aperture from a volume outside the enclosure and a pressure controller communicating with the enclosed specimen placement volume and being operative to maintain the enclosed specimen placement volume at a pressure which exceeds a vapor pressure of a liquid sample in the specimen placement volume and is greater than a pressure of a volume outside the enclosure, whereby a pressure differential across the cover does not exceed a threshold level at which rupture of the cover would occur.

In accordance with another preferred embodiment of the present invention the pressure controller includes a passageway communicating with the enclosed specimen placement volume. Preferably, the passageway includes a tube having a lumen whose cross section is sufficiently small as to maintain the pressure, which exceeds the vapor pressure of the liquid sample in the specimen placement volume and is greater than the pressure of the volume outside the enclosure, for a time period of at least 15 minutes. Additionally, the tube communicates with a fluid reservoir.

In accordance with yet another preferred embodiment of the present invention the specimen enclosure assembly also includes a liquid ingress and egress assembly permitting supply and removal of liquid from the enclosed specimen placement volume. Preferably, the liquid ingress and egress assembly includes at least two tubes.

There is also provided in accordance with another preferred embodiment of the present invention a specimen enclosure assembly for use in an electron microscope and including a rigid specimen enclosure dish having an aperture and defining an enclosed specimen placement volume, an electron beam permeable, fluid impermeable, cover sealing the specimen placement volume at the aperture from a volume outside the enclosure and a liquid ingress and egress assembly permitting supply and removal of liquid from the enclosed specimen placement volume.

Preferably, the liquid ingress and egress assembly includes at least two tubes.

There is further provided in accordance with yet another preferred embodiment of the present invention a scanning electron microscope assembly including a scanning electron microscope defining an examination volume, a specimen enclosure assembly disposed in the examination volume and including a rigid specimen enclosure dish having an aperture and defining an enclosed specimen placement volume, an election beam permeable, fluid impermeable, cover sealing the specimen placement volume at the aperture from a volume outside the enclosure and a pressure controller communicating with the enclosed specimen placement volume and being operative to maintain the enclosed specimen placement volume at a pressure which exceeds a vapor pressure of a liquid sample in the specimen placement volume and is greater than a pressure of a volume outside the enclosure, whereby a pressure differential across the cover does not exceed a threshold level at which rupture of the cover would occur.

In accordance with another preferred embodiment of the present invention the pressure controller includes a passageway communicating with the enclosed specimen placement volume. Preferably, the passageway includes a tube having a lumen whose cross section is sufficiently small as to maintain the pressure, which exceeds the vapor pressure of the liquid sample in the specimen placement volume and is greater than the pressure of the volume outside the enclosure, for a time period of at least 15 minutes. Additionally, the tube communicates with a fluid reservoir.

In accordance with yet another preferred embodiment of the present invention the scanning electron microscope also includes a liquid ingress and egress assembly permitting supply and removal of liquid from the enclosed specimen placement volume. Preferably, the liquid ingress and egress assembly includes at least two tubes.

There is also provided in accordance with yet another preferred embodiment of the present invention a specimen enclosure assembly for use in an electron microscope and including a fluid reservoir, a plurality of rigid specimen enclosure dishes, each having an aperture and defining an enclosed specimen placement volume, the plurality of rigid specimen enclosure dishes communicating with the fluid reservoir, an electron beam permeable, fluid impermeable, cover sealing each of the specimen placement volumes at the apertures from a volume outside each of the enclosures, and a pressure controller communicating with the fluid reservoir and being operative to maintain the enclosed specimen placement volumes at a pressure which exceeds a vapor pressure of a liquid sample in the specimen placement volumes and is greater than a pressure of a volume outside the fluid reservoir, whereby a pressure differential across the covers does not exceed a threshold level at which rupture of the covers would occur.

In accordance with another preferred embodiment of the present invention the pressure controller includes a passageway. Preferably, the passageway includes a tube having a lumen whose cross section is sufficiently small as to maintain the pressure, which exceeds the vapor pressure of the liquid sample in the specimen placement volume and is greater than the pressure of the volume outside the plurality of enclosures, for a time period of at least 15 minutes. Additionally, the tube communicates with the fluid reservoir. Additionally or alternatively, the specimen enclosure assembly also includes a liquid ingress and egress assembly permitting supply and removal of liquid from the enclosed specimen placement volume. Preferably, the liquid ingress and egress assembly includes at least two tubes.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
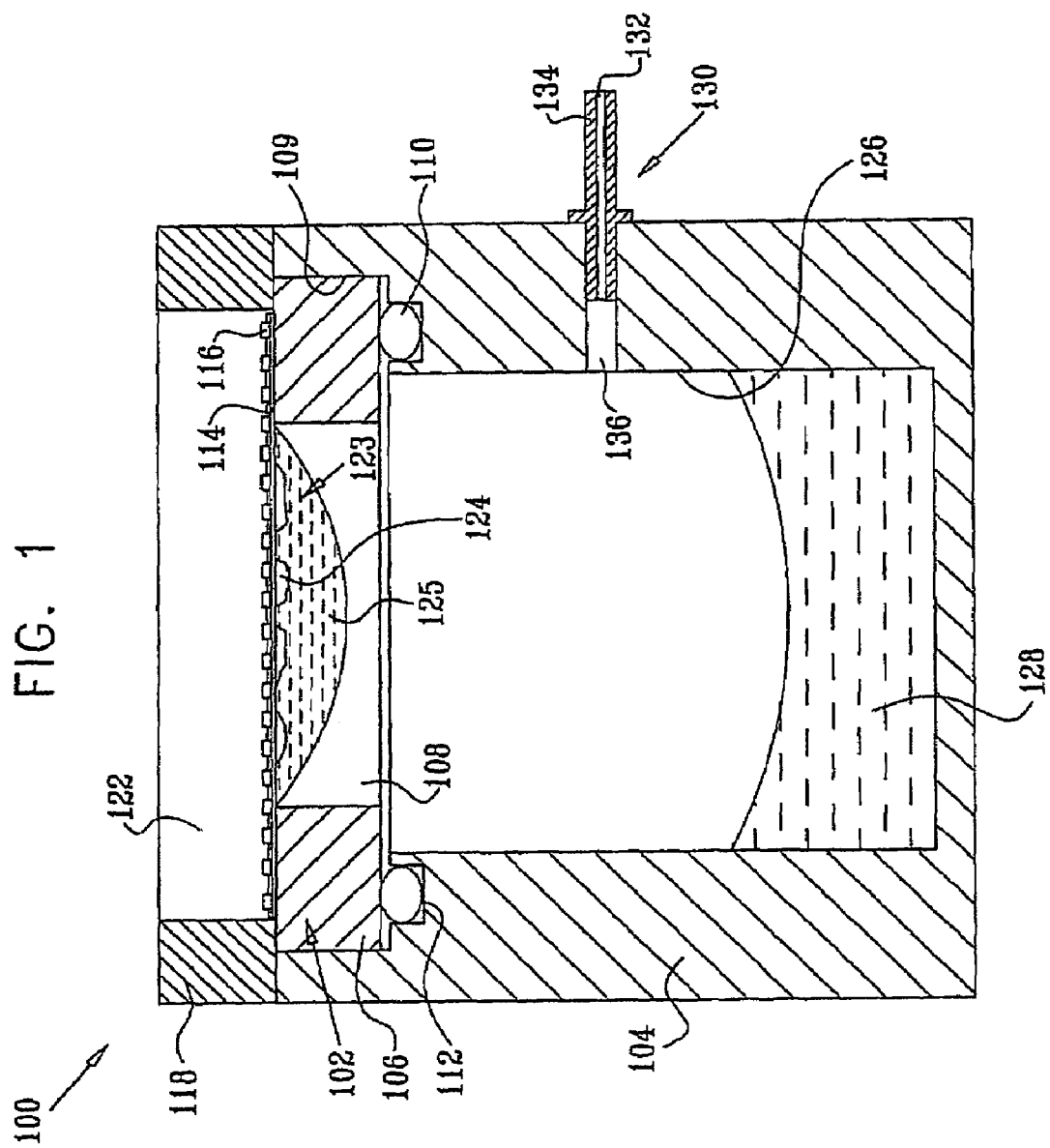
FIG. 1 is a simplified sectional illustration of a specimen enclosure assembly constructed and operative in accordance with a preferred embodiment of the present invention.

Reference is now made to FIG. 1, which is a simplified sectional illustration of a specimen enclosure assembly 100 constructed and operative in accordance with a preferred embodiment of the present invention. As seen in FIG. 1, the specimen enclosure assembly 100 comprises a specimen enclosure dish 102 seated in a container 104.

Specimen enclosure dish 102 preferably is formed of a ting 106 having a generally central aperture 108. Ring 106 is preferably formed of PMMA (polymethyl methacrylate), such as Catalog No. 692106001000, commercially available from Irpen S. A. of Barcelona, Spain, and preferably defines a specimen placement enclosure with a volume of approximately 20 microliters and a height of approximately 2 mm. The specimen enclosure dish 102 is seated in a recess 109 formed in a top of the container 104.

An O-ring 110 is preferably disposed between ring 106 and an interior surface 112 of container 104.

An electron beam permeable, fluid impermeable, cover 114 is placed on specimen enclosure dish 102 against and over central aperture 108.

The electron beam permeable, fluid impermeable, cover 114 preferably comprises a polyimide membrane, such as Catalog No. LWN00020, commercially available from Moxtek Inc. of Orem, Utah, U.S.A. Cover 114 is adhered, as by an adhesive, to a mechanically supporting grid 116, which is not shown to scale, such as Catalog No. 2007N or Catalog No. 2005N, which is commercially available from Structure Probe Inc. of 569 East Gay Street, West Chester, Pa., U.S.A. A preferred adhesive is commercially available from Norland Products Inc. of Cranbury, N.J., U.S.A., identified by Catalog No. NOA61. The electron beam permeable, fluid impermeable, cover 114 is also adhered to ring 106, preferably by an adhesive, such as Catalog No. NOA61, commercially available from Norland Products Inc. of Cranbury, N.J., U.S.A.

A top element 118 is provided to retain the specimen enclosure dish 102 in container 104. Top element 118 is preferably formed as a ring having a generally central aperture 122 and is attached to container 104 by any conventional means, such as by screws (not shown).

A specimen 123, typically containing cells 124 in a liquid medium 125, is typically located within the specimen enclosure dish 102, lying against the electron beam permeable, fluid impermeable, cover 114. Examples of specimens containing liquid may include cell cultures, blood and bacteria. It is noted that the liquid 125 in specimen 123 does not flow out of the specimen enclosure dish 102 due to surface tension.

Container 104 defines a fluid reservoir 126 containing at least one fluid. The fluid preferably comprises a liquid 128, such as water or specimen liquid. The liquid 128 in fluid reservoir 126 is provided to supply the specimen enclosure dish 102 with vapor, such as water vapor, so as to prevent evaporation of the specimen liquid 125 by permitting vapor flow into specimen enclosure dish 102 through aperture 108.

A pressure controller assembly 130 is operative to maintain the specimen enclosure dish 102, during microscopic inspection, generally over a time duration in a range of several minutes to several hours, typically a time period of at least 15 minutes, at a pressure which exceeds a vapor pressure of the specimen 123 and is greater than a pressure of a volume outside the specimen enclosure assembly 100, whereby a pressure differential across the electron beam permeable, fluid impermeable, cover 114 does not exceed a threshold level at which rupture of cover 114 would occur.

The pressure controller assembly 130 preferably comprises a tube 132, such as Catalog No. MF34G-5 or Catalog No. MF28G-5, commercially available from World Precision Instruments Inc. of 175 Sarasota Center Boulevard, Sarasota, Fla., U.S.A., and a tube housing 134.

Tube 132 is inserted into an aperture 136 formed in a wall of container 104 above a surface of the liquid 128 in the fluid reservoir 126. Tube 132 is sealingly attached to the container wall so that fluid flows from container 104 only through the tube 132. It is a particular feature of the present invention that the tube 132 has a lumen with a cross section sufficiently small, preferably of a diameter in a range of 50 to 150 micrometers, to provide for relatively slow dissipation of pressure from the specimen enclosure assembly 100.

Figure 2:
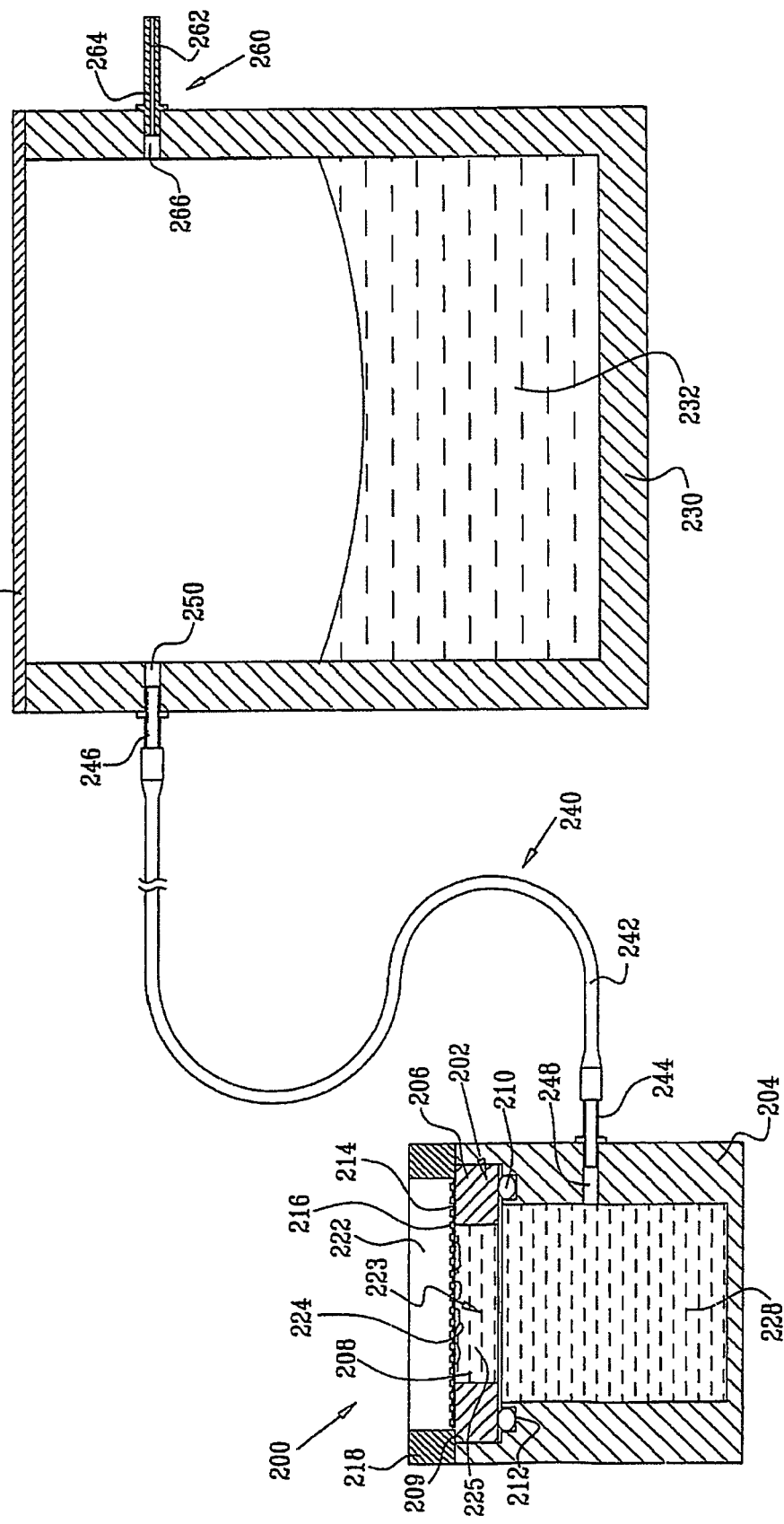
FIG. 2 is a simplified sectional illustration of a specimen enclosure assembly constructed and operative in accordance with another preferred embodiment of the present invention.

Reference is now made to FIG. 2, which is a simplified sectional illustration of a specimen enclosure assembly 200 constructed and operative in accordance with another preferred embodiment of the present invention. As seen in FIG.

2, the specimen enclosure assembly 200 comprises a specimen enclosure dish 202 seated in a container 204.

Specimen enclosure dish 202 preferably is formed of a ring 206 having a generally central aperture 208. Ring 206 is preferably formed of PMMA (polymethyl methacrylate), such as Catalog No. 692106001000, commercially available from Irpen S. A. of Barcelona, Spain, and preferably defines a specimen placement enclosure with a volume of approximately 20 microliters and a height of approximately 2 mm. The specimen enclosure dish 202 is seated in a recess 209 formed in a top of the container 204.

An O-ring 210 is preferably disposed between ring 206 and an interior surface 212 of container 204.

An electron beam permeable, fluid impermeable, cover 214 is placed on specimen enclosure dish 202 against and over central aperture 208.

The electron beam permeable, fluid impermeable, cover 214 preferably comprises a polyimide membrane, such as Catalog No. LWN00020, commercially available from Moxtek Inc. of Orem, Utah, U.S.A. Cover 214 is adhered, as by an adhesive, to a mechanically supporting grid 216, which is not shown to scale, such as Catalog No. 2007N or Catalog No. 2005N, which is commercially available from Structure Probe Inc. of 569 East Gay Street, West Chester, Pa., U.S.A. A preferred adhesive is commercially available from Norland Products Inc. of Cranbury, N.J., U.S.A., identified by Catalog No. NOA61. The electron beam permeable, fluid impermeable, cover 214 is also adhered to ring 206, preferably by an adhesive, such as Catalog No. NOA61, commercially available from Norland Products Inc. of Cranbury, N.J., U.S.A. A top element 218 is provided to retain the specimen enclosure dish 202 in container 204. Top element 218 is preferably formed of as a ring having a generally central aperture 222 and is attached to container 204 by any conventional means, such as by screws (not shown).

A specimen 223, typically containing cells 224 in a liquid medium 225, is typically located within the specimen enclosure dish 202, lying against the electron beam permeable, fluid impermeable, cover 214. Examples of specimens containing liquid may include cell cultures, blood and bacteria.

Container 204 contains at least one fluid. The fluid preferably comprises a liquid 228, such as water or specimen liquid. Liquid 228 typically fills container 204 and specimen enclosure dish 202, as shown in FIG. 2, or fills part of container 204, similar to reservoir 126 shown in FIG. 1. The liquid 228 in container 204 is provided to supply the specimen enclosure dish 202 with vapor, such as water vapor, so as to prevent evaporation of the specimen liquid 225.

A fluid reservoir 230 contains at least one fluid in addition to the fluid contained in the specimen enclosure assembly 200. The fluid preferably comprises a liquid 232, such as water or specimen liquid. Preferably, fluid reservoir 230 has a larger internal volume than specimen enclosure assembly 200. A lid 234 covers fluid reservoir 230 and is attached to fluid reservoir 230 by any conventional means, such as by screws (not shown). The liquid 232 in fluid reservoir 230 is provided to supply the specimen is enclosure assembly 200 with additional vapor, such as water vapor, in addition to the container liquid 228, so as to Anther prevent evaporation of the specimen liquid 225, by permitting vapor flow into specimen enclosure dish 202 through a fluid passageway 240.

The fluid passageway 240 comprises a conduit 242 having a first end portion and a second end portion, designated by reference numerals 244 and 246 respectively. First end portion 244 is inserted into an aperture 248 formed in a wall of container 204 and second end portion 246 is inserted into an aperture 250 formed in a wall of fluid reservoir 230.

A pressure controller assembly 260 is operative to maintain the specimen enclosure dish 202, during microscopic inspection, generally over a time duration in a range of several minutes to several hours, typically a time period of at least 15 minutes, at a pressure which exceeds a vapor pressure of the specimen 223 and is greater than a pressure of a volume outside the specimen enclosure assembly 200, whereby a pressure differential across the electron beam permeable, fluid impermeable, cover 214 does not exceed a threshold level at which rupture of cover 214 would occur. Additionally, the fluid in fluid reservoir 230 is provided to further maintain the pressure within the specimen enclosure assembly 200, as described hereinabove, during microscopic inspection.

The pressure controller assembly 260 preferably comprises a tube 262, such as Catalog No. MF34G-5 or Catalog No. M28G-5, commercially available from World Precision Instruments Inc. of 175 Sarasota Center Boulevard, Sarasota, Fla., U.S.A., and a tube housing 264.

Tube 262 is inserted into an aperture 266 formed in the fluid reservoir wall above a surface of the liquid 232 in the fluid reservoir 230. Tube 262 is sealingly attached to the fluid reservoir wall so that fluid flows from fluid reservoir 230 only through the tube 262 and fluid passageway 240. It is a particular feature of the present invention that the tube 262 has a lumen with a cross section sufficiently small, preferably of a diameter in a range of 50 to 150 micrometers, to provide for relatively slow dissipation of pressure from the fluid reservoir 230.

Figure 3:
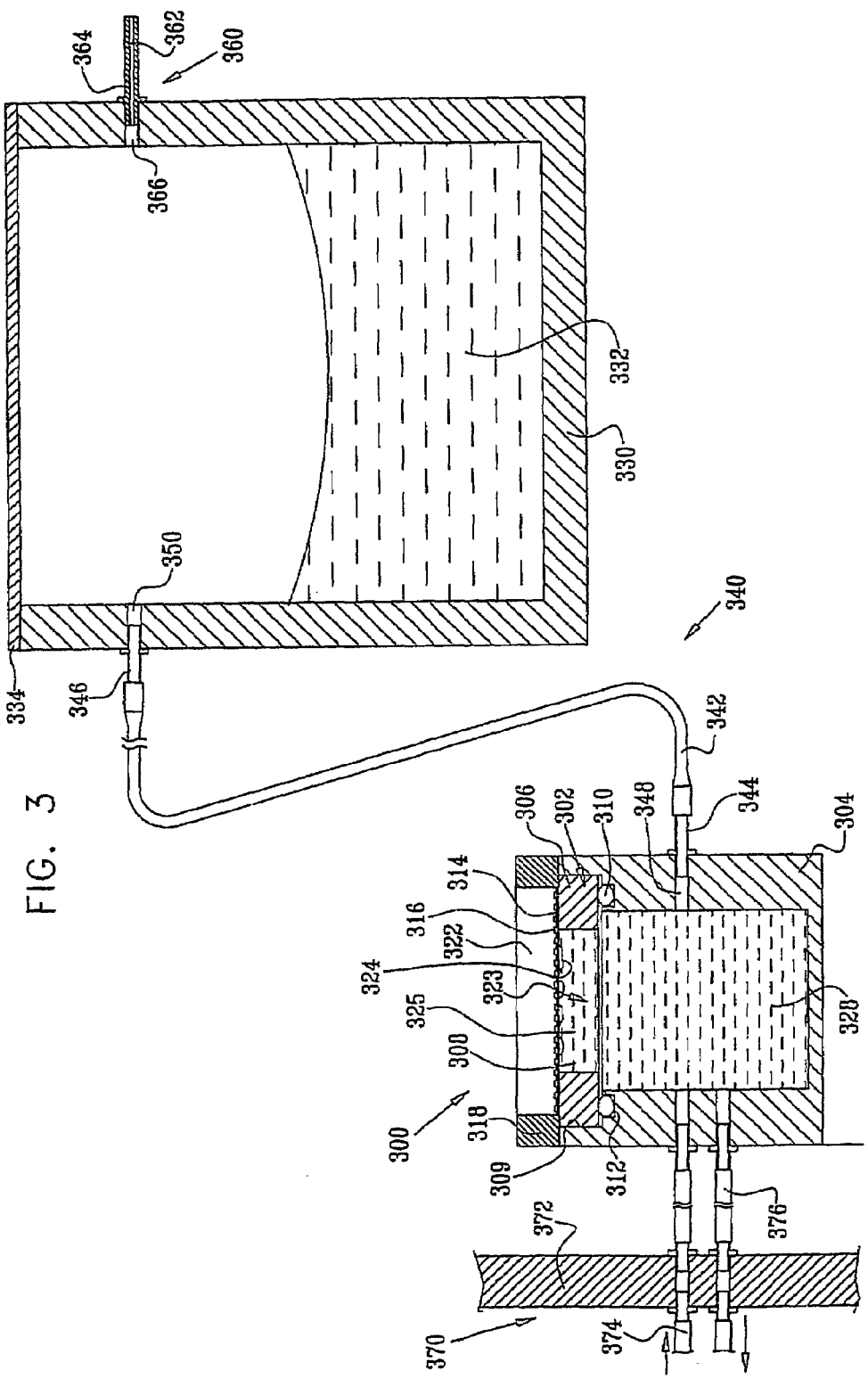
FIG. 3 is a simplified sectional illustration of a specimen enclosure assembly constructed and operative in accordance with yet another preferred embodiment of the present invention.

Reference is now made to FIG. 3, which is a simplified sectional illustration of a specimen enclosure assembly 300 constructed and operative in accordance with yet another preferred embodiment of the present invention. As seen in FIG. 3, the specimen enclosure assembly 300 comprises a specimen enclosure dish 302 seated in a container 304.

Specimen enclosure dish 302 preferably is formed of a ring 306 having a generally central aperture 308. Ring 306 is preferably formed of PE (polymethyl methacrylate), such as Catalog No. 692106001000, commercially available from Irpen S. A. of Barcelona, Spain, and preferably defines a specimen placement enclosure with a volume of approximately 20 microliters and a height of approximately 2 mm. The specimen enclosure dish 302 is seated in a recess 309 formed in a top of the container 304.

An O-ring 310 is preferably disposed between ring 306 and an interior surface 312 of container 304.

An electron beam permeable, fluid impermeable, cover 314 is placed on specimen enclosure dish 302 against and over central aperture 308.

The electron beam permeable, fluid impermeable, cover 314 preferably comprises a polyimide membrane, such as Catalog No. LWN00020, commercially available from Moxtek Inc. of Orem, Utah, U.S.A. Cover 314 is adhered, as by an adhesive, to a mechanically supporting grid 316, which is not shown to scale, such as Catalog No. 2007N or Catalog No. 2005N, which is commercially available from Structure Probe Inc. of 569 East Gay Street, West Chester, Pa., U.S. A preferred adhesive is commercially available from Norland Products Inc. of Cranbury, N.J., U.S.A., identified by Catalog No. NOA61 The electron beam permeable, fluid impermeable, cover 314 is also adhered to ring 306, preferably by an adhesive, such as Catalog No. NOA61, commercially available from Norland Products Inc. of Cranbury, N.J., U.S.A. A top element 318 is provided to retain the specimen enclosure dish 302 in container 304. Top element 318 is preferably formed as a ring having a generally central aperture 372 and is attached to container 304 by any conventional means, such as by screws (not shown).

A specimen 323, typically containing cells 324 in a liquid medium 325, is typically located within the specimen enclosure dish 302, lying against the electron beam permeable, fluid impermeable, cover 314. Examples of specimens containing liquid may include cell cultures, blood and bacteria.

Container 304 contains a liquid 328, such as water or specimen liquid, filling container 304 and the specimen enclosure dish 302.

A fluid reservoir 330 contains at least one fluid in addition to the fluid contained in the specimen enclosure assembly 300. The fluid preferably comprises a liquid 332, such as water or specimen liquid. Preferably, fluid reservoir 330 has a larger internal volume than specimen enclosure assembly 300. A lid 334 covers fluid reservoir 330 and is attached to fluid reservoir 330 by any conventional means, such as by screws (not shown). The liquid 332 in fluid reservoir 330 is provided to supply the specimen enclosure assembly 300 with additional vapor, such as water vapor, in addition to the container liquid 328, so as to further prevent evaporation of the specimen liquid 325, by permitting vapor flow into specimen enclosure dish 302 through a fluid passageway 340.

The fluid passageway 340 comprises a conduit 342 having a first end portion and a second end portion, designated by reference numerals 344 and 346 respectively. First end portion 344 is inserted into an aperture 348 formed in a wall of container 304 and second end portion 346 is inserted into an aperture 350 formed in a wall of fluid reservoir 330.

A pressure controller assembly 360 is operative to maintain the specimen enclosure dish 302, during microscopic inspection, generally over a time duration in a range of several minutes to several hours, typically a time period of at least 15 minutes, at a pressure which exceeds a vapor pressure of the specimen 323 and is greater than a pressure of a volume outside the specimen enclosure assembly 300, whereby a pressure differential across the electron beam permeable, fluid impermeable, cover 314 does not exceed a threshold level at which rupture of cover 314 would occur, Additionally, the fluid in fluid reservoir 330 is provided to further maintain the pressure within the specimen enclosure assembly 300, as described hereinabove, during microscopic inspection.

The pressure controller assembly 360 preferably comprises a tube 362, such as Catalog No. MF34(G-5 or Catalog No. MF28G-5, commercially available from World Precision Instruments Inc. of 175 Sarasota Center Boulevard, Sarasota, Fla., U.S.A., and a tube housing 364.

Tube 362 is inserted into an aperture 366 formed in the fluid reservoir wall above a surface of the liquid 332 in the fluid reservoir 330. Tube 362 is sealingly attached to the fluid reservoir wall so that fluid flows from fluid reservoir 330 only through the tube 362 and fluid passageway 340. It is a particular feature of the present invention that the tube 362 has a lumen with a cross section sufficiently small, preferably with a diameter in a range of 50 to 150 micrometers, to provide for relatively slow dissipation of pressure from the fluid reservoir 330.

Specimen enclosure assembly 300 is preferably provided with a liquid ingress and egress assembly 370 so as to permit supply and removal of liquid from the specimen enclosure assembly 300 to an environment outside a SEM enclosure wall, here designated by reference numeral 372. Liquid ingress and egress assembly 370 preferably comprises an inlet conduit 374 and an outlet conduit 376 attached to specimen enclosure assembly 300.

Figure 4:
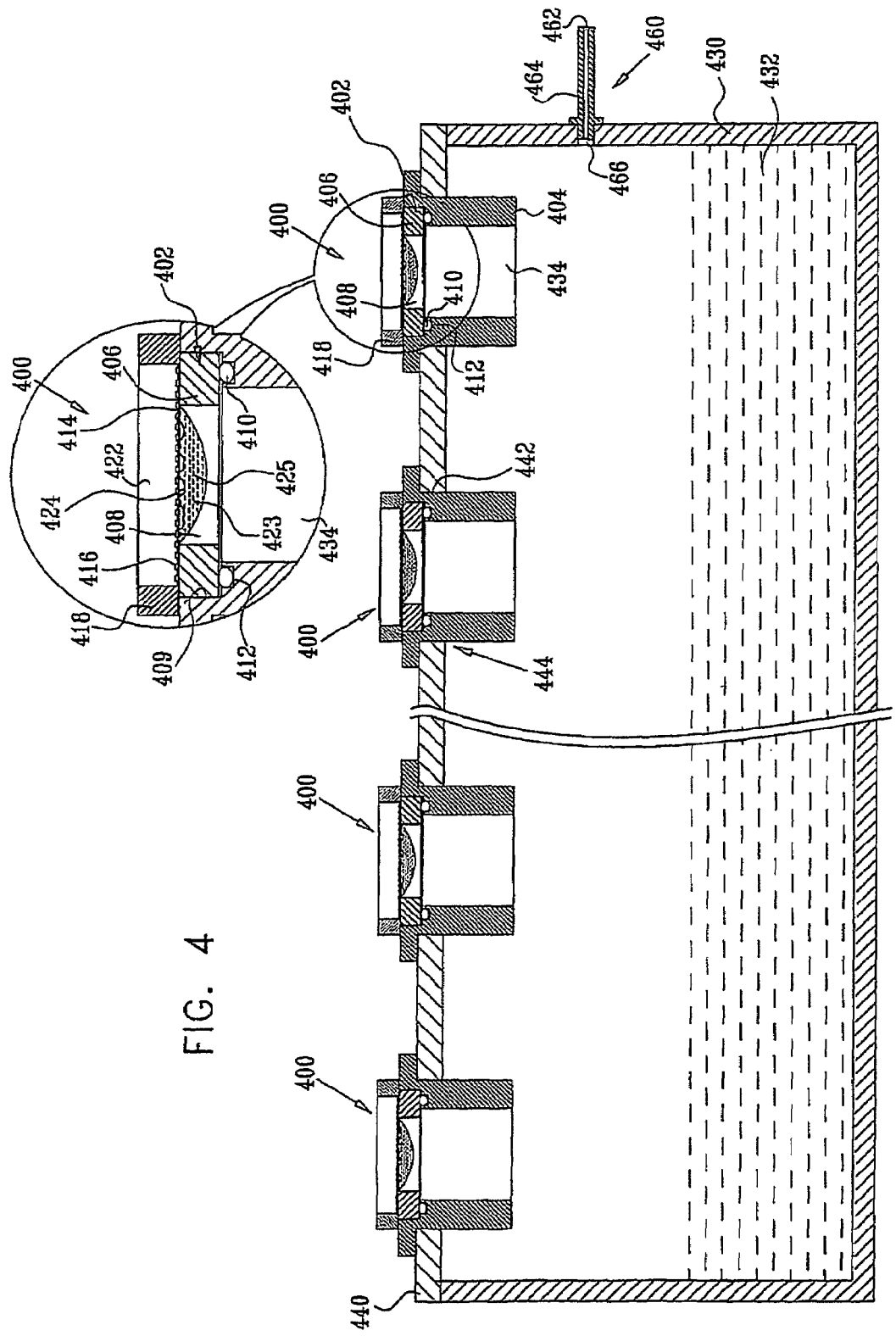
FIG. 4 is a simplified sectional illustration of a multiple specimen enclosure assembly constructed and operative in accordance with a preferred embodiment of the present invention.

Reference is now made to FIG. 4, which is a simplified sectional illustration of a multiple specimen enclosure assembly constructed and operative in accordance with a preferred embodiment of the present invention. As seen in FIG. 4, the multiple specimen enclosure assembly is comprised of a plurality of individual specimen enclosure assemblies 400.

Each specimen enclosure assembly 400 comprises a specimen enclosure dish 402 seated in a container 404.

Specimen enclosure dish 402 preferably is formed of a ring 406 having a generally central aperture 408. Ring 406 is preferably formed of PEA (polymethyl methacrylate), such as Catalog No. 692106001000, commercially available from Irpen S. A. of Barcelona, Spain, and preferably defines a specimen placement enclosure with a volume of approximately 20 microliters and a height of approximately 2 mm. The specimen enclosure dish 402 is seated in a recess 409 formed in a top of the container 404

An O-ring 410 is preferably disposed between ring 406 and an interior surface 412 of container 404.

An electron beam permeable, fluid impermeable, cover 414 is placed on specimen enclosure dish 402 against and over central aperture 408.

The electron beam permeable, fluid impermeable, cover 414 preferably comprises a polyimide membrane, such as Catalog No. LWN00020, commercially available from Moxtek Inc. of Orem, Utah, U.S.A. Cover 414 is adhered, as by an adhesive, to a mechanically supporting grid 416, which is not shown to scale, such as Catalog No. 2007N or Catalog No. 2005N, which is commercially available from Structure Probe Inc. of 569 East Gay Street, West Chester, Pa., U.S.A. A preferred adhesive is commercially available from Norland Products Inc. of Cranbury, N.J., U.S.A., identified by Catalog No. NOA61. The electron beam permeable, fluid impermeable, cover 414 is also adhered to ring 406, preferably by an adhesive, such as Catalog No. NOA61, commercially available from Norland Products Inc. of Cranbury, N.J., U.S.A.

A top element 418 is provided to retain the specimen enclosure dish 402 in container 404. Top element 418 is preferably formed as a ring having a generally central aperture 422 and is attached to container 404 by any conventional means, such as by screws (not shown).

A specimen 423, typically containing cells 424 in a liquid medium 425, is typically located within the specimen enclosure dish 402, lying against the electron beam permeable, fluid impermeable, cover 414. Examples of specimens containing liquid may include cell cultures, blood and bacteria. It is noted that the liquid 425 in specimen 423 does not flow out of the specimen enclosure dish 402 due to surface tension.

The multiple specimen enclosure assembly, as shown in FIG. 4, also comprises a fluid reservoir 430 containing at least one fluid. The fluid preferably comprises a liquid 432, such as water or specimen liquid. The liquid 432 in fluid reservoir 430 is provided to supply each specimen enclosure assembly 400 with vapor, such as water vapor, so as to prevent evaporation of the specimen liquid 425 by permitting vapor flow into individual specimen enclosure assemblies 400 through apertures 434 formed on a bottom surface of containers 404.

A lid 440 defines an array of specimen enclosure assembly support locations 442. Each specimen enclosure support location 442 is preferably defined by a recess 444 arranged to receive specimen enclosure assemblies 400. Specimen enclosure assemblies 400 are sealingly attached to lid 440, by any conventional means, such as by screws (not shown), so as to prevent dissipation of fluid from lid 440.

Lid 440 covers the fluid reservoir 430 and is attached to fluid reservoir 430 by any conventional means, such as by screws (not shown).

A pressure controller assembly 460 is operative to maintain, during microscopic inspection, generally over a time duration in a range of several minutes to several hours, typically a time period of at least 15 minutes, each specimen enclosure dish 402 at a pressure which exceeds a vapor pressure of the liquid specimen 423 and is greater than a pressure of a volume outside the specimen enclosure assembly 400, whereby a pressure differential across the electron beam permeable, fluid impermeable, cover 414 does not exceed a threshold level at which rupture of cover 414 would occur.

The pressure controller assembly 460 preferably comprises a tube 462, such as Catalog No. MF34G-5 or Catalog No. MF28G-5, commercially available from World Precision Instruments Inc. of 175 Sarasota Center Boulevard, Sarasota, Fla., U.S.A., and a tube housing 464.

Tube 462 is inserted into an aperture 466 formed in a wall of fluid reservoir 430 above a surface of the liquid 432. Tube 462 is sealingly attached to the fluid reservoir wall so that fluid flows from fluid reservoir 430 only through the tube 462. It is a particular feature of the present invention that the tube 462 has a lumen with a cross section sufficiently small, preferably with a diameter in a range of 50 to 150 micrometers, to provide for relatively slow dissipation of pressure from the specimen enclosure assembly 400.

Figure 5:
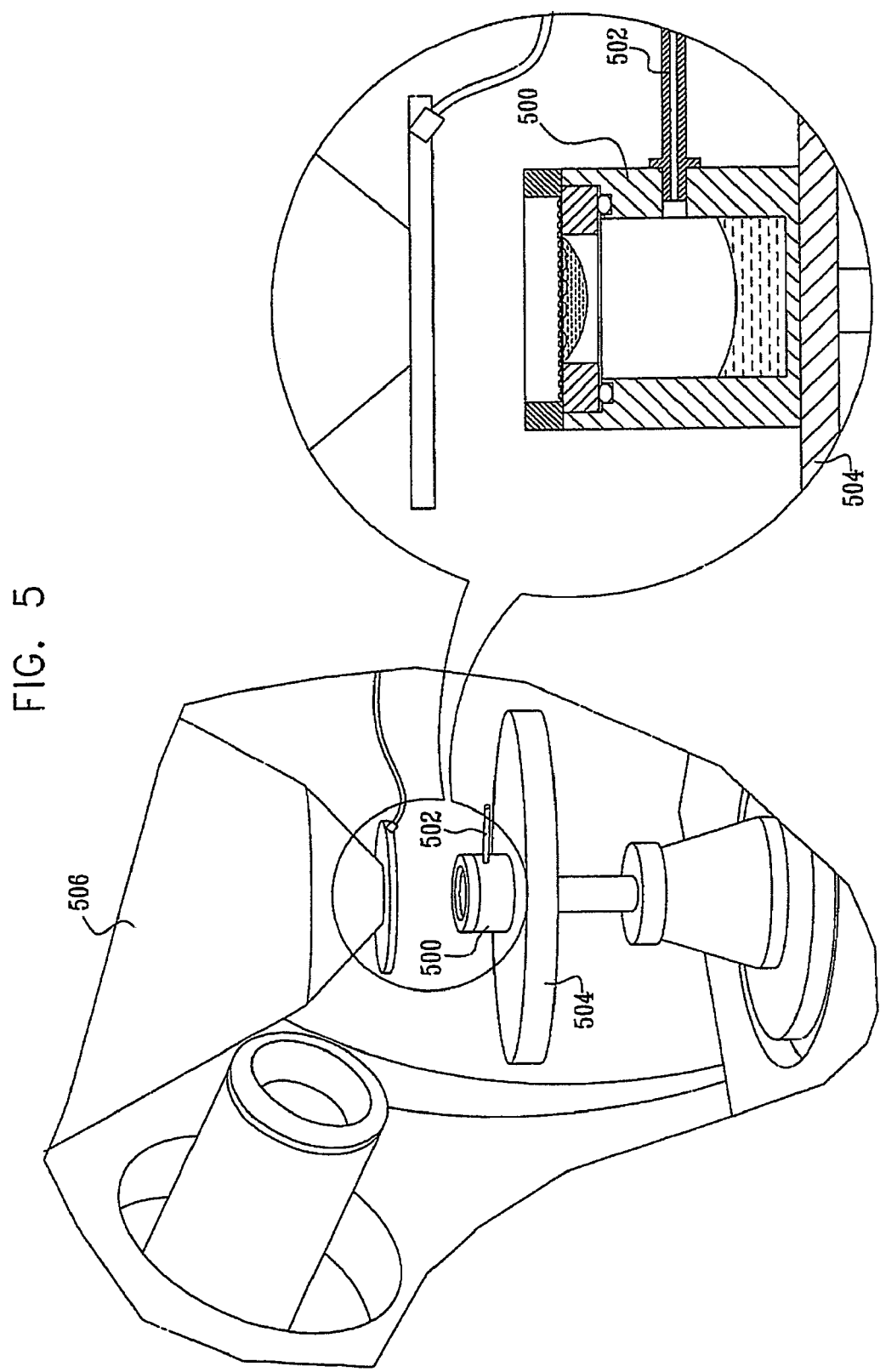
FIG. 5 is a simplified pictorial and sectional illustration of a scanning electron microscope including the specimen enclosure assembly of FIG. 1.

Reference is now made to FIG. 5, which is a simplified pictorial and sectional illustration of a SEM including the specimen enclosure assembly of FIG. 1. As seen in FIG. 5, the specimen enclosure assembly, here designated by reference numeral 500, is engaged with a pressure controller assembly, here designated by reference numeral 502. Specimen enclosure assembly 500 and pressure controller assembly 502 are shown positioned on a stage 504 of a SEM 506.

Figure 6:
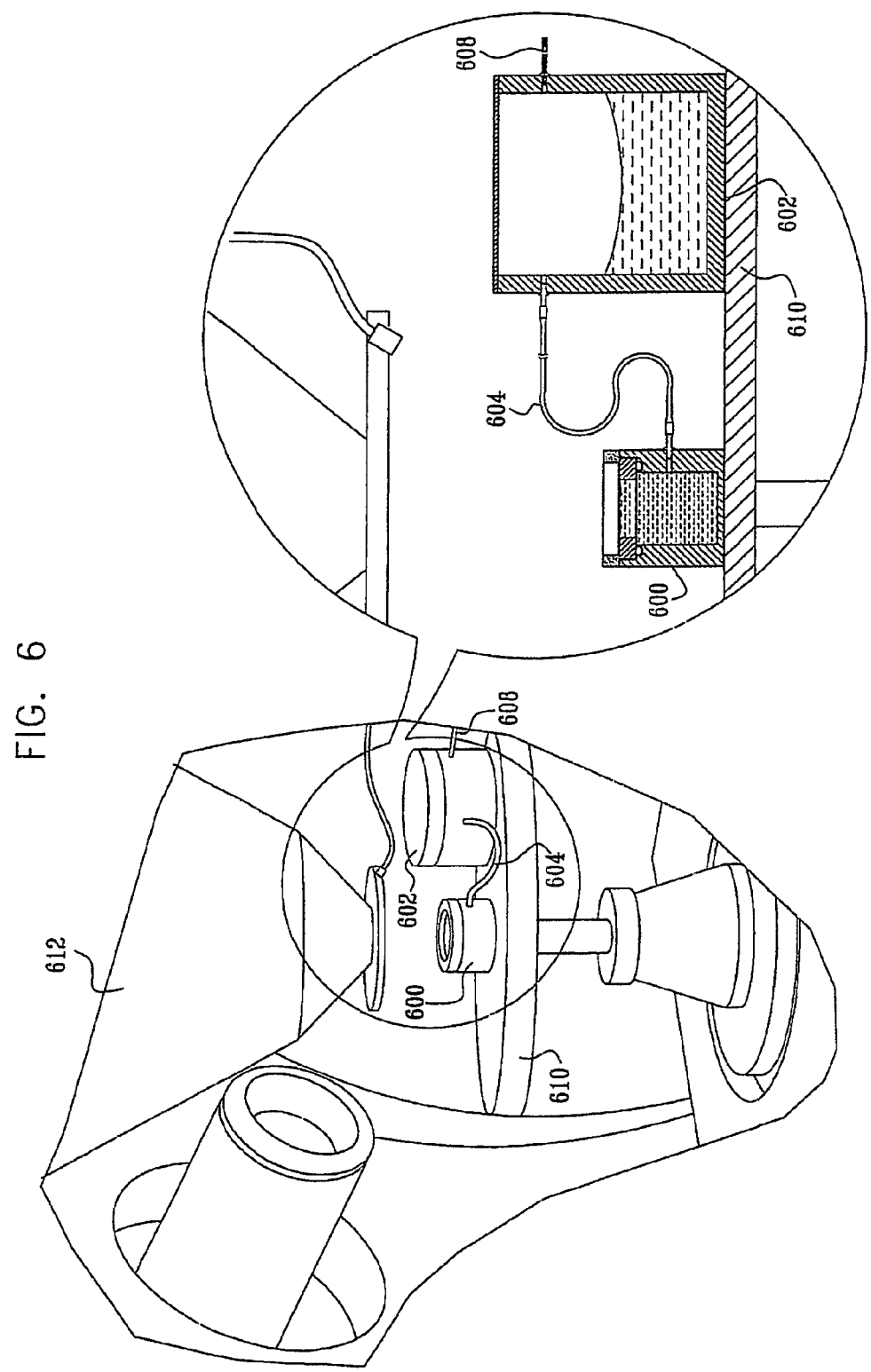
FIG. 6 is a simplified pictorial and sectional illustration of a scanning electron microscope including the specimen enclosure assembly of FIG. 2.

Reference is now made to FIG. 6, which is a simplified pictorial and sectional illustration of a SEM including the specimen enclosure assembly of FIG. 2. As seen in FIG. 6, the specimen enclosure assembly, here designated by reference numeral 600, is engaged with a fluid reservoir, here designated by reference numeral 602, via a fluid passageway 604. A pressure controller assembly, here designated by reference numeral 608, is engaged with fluid reservoir 602. Specimen enclosure assembly 600 and fluid reservoir 602 are shown positioned on a stage 610 of a SEM 612.

Figure 7:
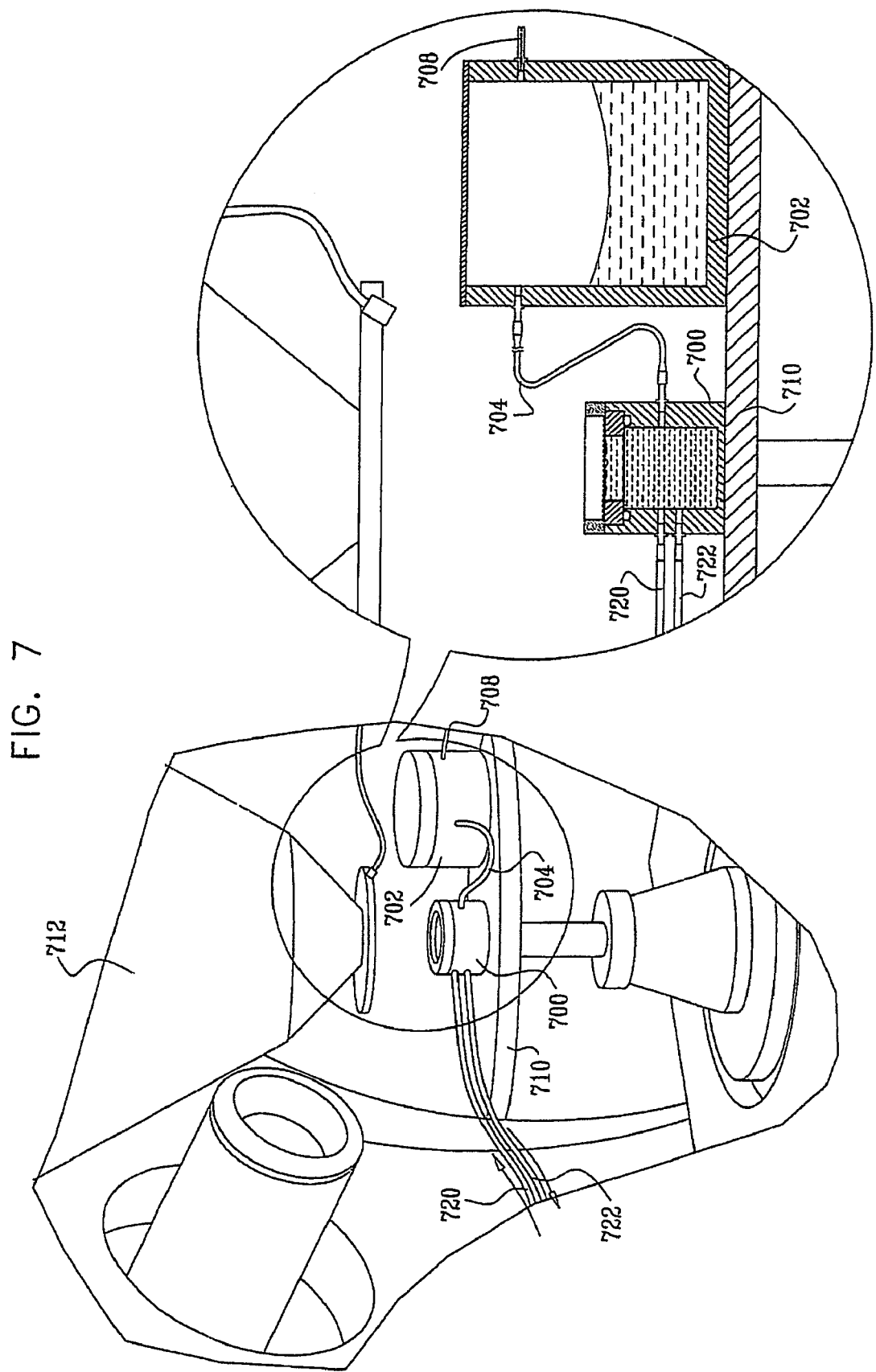
FIG. 7 is a simplified pictorial and sectional illustration of a scanning electron microscope including the specimen enclosure assembly of FIG. 3.

Reference is now made to FIG. 7, which is a simplified pictorial and sectional illustration of a SEM including the specimen enclosure assembly of FIG. 3. As seen in FIG. 7, the specimen enclosure assembly, here designated by reference numeral 700, is engaged with a fluid reservoir, here designated by reference numeral 702, via a fluid passageway 704. A pressure controller assembly, here designated by reference numeral 708, is engaged with fluid reservoir 702. Specimen enclosure assembly 700 and fluid reservoir 702 are shown positioned on a stage 710 of a SEM 712. An inlet conduit 720 and an outlet conduit 722 are attached to the specimen enclosure assembly 700.

Figure 8:
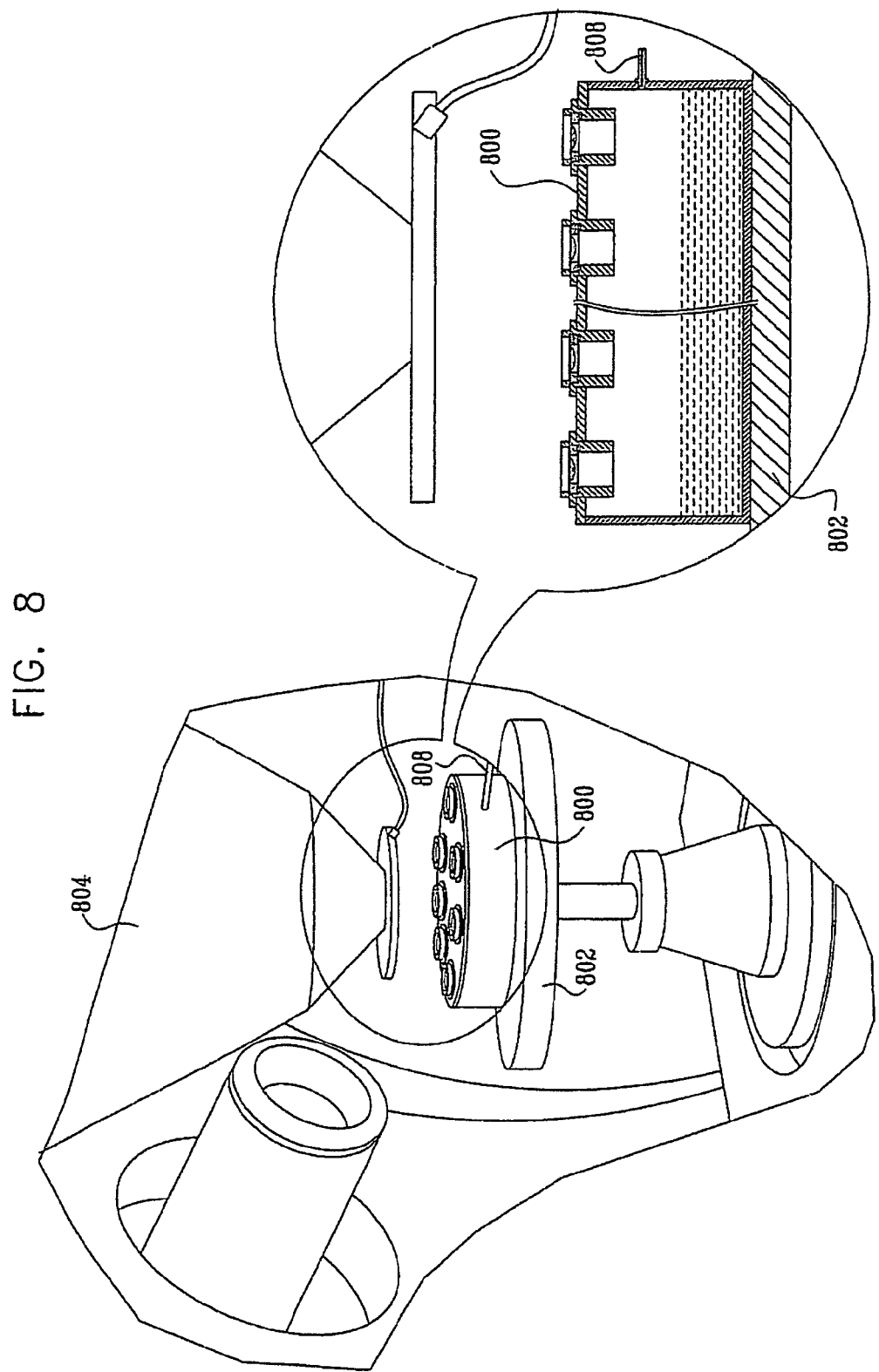
FIG. 8 is a simplified pictorial and sectional illustration of a scanning electron microscope including the multiple specimen enclosure assembly of FIG. 4.

Reference is now made to FIG. 8, which is a simplified pictorial and sectional illustration of a SEM including the multiple specimen enclosure assembly of FIG. 4. As seen in FIG. 8, the multiple specimen enclosure assembly, here designated by reference numeral 800, is shown positioned on a stage 802 of a SEM 804. A pressure controller assembly, here designated by reference numeral 808, is engaged with the multiple specimen enclosure assembly 800.

It will be appreciated by persons skilled in the art that the present invention is not limited to what has been particularly shown and described hereinabove. Rather the scope of the present invention includes both combinations and subcombinations of the various features described hereinabove as well as modifications and variations thereof as would occur to a person of skill in the art upon reading the foregoing specification and which are not in the prior art.

The invention claimed is:

1. A specimen enclosure assembly for use in an electron microscope and comprising:
   a specimen enclosure dish having an aperture and defining an enclosed specimen placement volume;
   an electron beam permeable, fluid impermeable, cover sealing said specimen placement volume at said aperture from a volume outside said specimen enclosure assembly; and
   a pressure controller communicating with said enclosed specimen placement volume, said pressure controller being configured for maintaining said enclosed specimen placement volume at a pressure which exceeds a vapor pressure of a sample in said specimen placement volume and is greater than a pressure of a volume outside said specimen enclosure assembly, wherein a pressure differential across said cover does not exceed a threshold level at which rupture of said cover would occur.

2. A specimen enclosure assembly according to claim 1 and wherein said specimen enclosure dish is a rigid specimen enclosure dish.

3. A specimen enclosure assembly according to claim 1 and wherein said pressure controller comprises a passageway communicating with said enclosed specimen placement volume.

4. A specimen enclosure assembly according to claim 3 and wherein said passageway comprises a fluid conduit having a lumen whose cross section is sufficiently small so as to maintain said pressure, which exceeds said vapor pressure of said sample in said specimen placement volume and is greater than said pressure of said volume outside said specimen enclosure assembly.

5. A specimen enclosure assembly according to claim 4 and wherein said fluid conduit comprises a tube.

6. A specimen enclosure assembly according to claim 4 and wherein said lumen of said fluid conduit has a circular cross section having a diameter in the range of 50–150 micrometers.

7. A specimen enclosure assembly according to claim 4 and wherein said fluid conduit communicates with a fluid reservoir.

8. A specimen enclosure assembly according to claim 7 and wherein said fluid reservoir comprises at least one fluid channel in fluid communication with said fluid conduit and a passageway formed in said fluid reservoir for fluid communication with said volume outside said specimen enclosure assembly.

9. A specimen enclosure assembly according to claim 8 and wherein said fluid channel of said fluid reservoir comprises at least one tube.

10. A specimen enclosure assembly according to claim 8 and wherein said passageway formed in said fluid reservoir comprises a fluid conduit having a lumen whose cross section is sufficiently small so as to maintain a pressure, which exceeds said vapor pressure of said sample in said specimen placement volume and is greater than said pressure of said volume outside said specimen enclosure assembly and said fluid reservoir.

11. A specimen enclosure assembly according to claim 1 and also comprising a fluid ingress and egress assembly permitting supply and removal of fluid from said enclosed specimen placement volume.

12. A specimen enclosure assembly according to claim 11 and wherein said fluid ingress and egress assembly comprises at least two fluid conduits.

13. A specimen enclosure assembly according to claim 12 and wherein at least one of said at least two fluid conduits of said fluid ingress and egress assembly comprises at least one tube.

14. A method for constructing a specimen enclosure assembly for use in a scanning electron microscope comprising:
providing a specimen enclosure dish having an aperture and defining an enclosed specimen placement volume;
attaching an cicetion beam permeable, fluid impermeable, cover to said specimen placement volume at said aperture for sealing said aperture from a volume outside said specimen enclosure assembly; and
providing a pressure controller communicating with said enclosed specimen placement volume, said pressure controller being configured for maintaining said enclosed specimen placement volume at a pressure, which exceeds a vapor pressure of a sample in said specimen placement volume and is greater than a pressure of a volume outside said specimen enclosure assembly, wherein a pressure differential across said cover does not exceed a threshold level at which rupture of said cover would occur.

15. A method according to claim 14 and wherein said providing said pressure controller comprises forming in said specimen enclosure assembly a passageway communicating with said volume outside said specimen enclosure assembly.

16. A method according to claim 15 and wherein said providing said pressure controller comprises sealingly attaching to said passageway a fluid conduit having a lumen whose cross section is sufficiently small to maintain said pressure, which exceeds said vapor pressure of said sample in said specimen placement volume and is greater than said pressure of said volume outside said specimen enclosure assembly.

17. A method according to claim 16 wherein said fluid conduit comprises at least one tube.

18. A method according to claim 16 and wherein said lumen of said fluid conduit has a circular cross section having a diameter in the range of 50–150 micrometers.

19. A method according to claim 16 and also including providing a fluid reservoir in fluid communication with said specimen enclosure assembly.

20. A method according to claim 19 and wherein said fluid reservoir comprises at least one fluid channel in fluid communication with said fluid conduit and a passageway formed in said fluid reservoir for communicating with said volume outside said specimen enclosure assembly.

21. A method according to claim 20 and wherein said fluid channel of said fluid reservoir comprises at least one tube.

22. A method according to claim 20 and wherein said passageway formed in said fluid reservoir comprises a fluid conduit having a lumen whose cross section is sufficiently small so as to maintain a pressure, which exceeds said vapor pressure of said sample in said specimen placement volume and is greater than said pressure of a volume outside said specimen enclosure assembly and said fluid reservoir.

23. A method according to claim 20 and wherein said passageway formed in said fluid reservoir also comprises a tube with a circular cross section having a diameter in the range of 50–150 micrometers.

24. A method according to claim 14 and also comprising providing a fluid ingress and egress assembly communicating with said enclosed specimen placement volume for permitting supply and removal of fluid from said enclosed specimen placement volume.

25. A method according to claim 24 and wherein said fluid ingress and egress assembly comprises at least two fluid conduits.

26. A method according to claim 25 and wherein at least one of said at least two fluid conduits of said fluid ingress and egress assembly comprises at least one tube communicating with said specimen placement volume.

* * * * *

UNITED STATES PATENT AND TRADEMARK OFFICE
CERTIFICATE OF CORRECTION

PATENT NO. : 7,304,313 B2  Page 1 of 1
APPLICATION NO. : 10/516407
DATED : December 4, 2007
INVENTOR(S) : Elisha Moses It is certified that error appears in the above-identified patent and that said Letters Patent is hereby corrected as shown below:

On the Title Page, Item (73) should read: YEDA RESEARCH AND DEVELOPMENT CO. LTD., Rehovot (IL)

Signed and Sealed this

Third Day of August, 2010

David J. Kappos
*Director of the United States Patent and Trademark Office*